(12) United States Patent
Oh et al.

(10) Patent No.: US 10,892,145 B2
(45) Date of Patent: Jan. 12, 2021

(54) SUBSTRATE PROCESSING APPARATUS, SUBSTRATE PROCESSING METHOD, AND METHOD OF FABRICATING SEMICONDUCTOR DEVICE USING THE SAME

(71) Applicant: Samsung Electronics Co., Ltd., Suwon-si (KR)

(72) Inventors: Sejin Oh, Hwaseong-si (KR); Kyohyeok Kim, Seoul (KR); Jongwoo Sun, Hwaseong-si (KR); Dougyong Sung, Seoul (KR); Sung-Ki Lee, Hwaseong-si (KR); Jaehyun Lee, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/445,423

(22) Filed: Jun. 19, 2019

(65) Prior Publication Data
US 2020/0168443 A1 May 28, 2020

(30) Foreign Application Priority Data
Nov. 22, 2018 (KR) .................. 10-2018-0145245

(51) Int. Cl.
*H01L 21/66* (2006.01)
*H01L 21/3065* (2006.01)
(Continued)

(52) U.S. Cl.
CPC ........ *H01J 37/32963* (2013.01); *G01N 21/94* (2013.01); *H01J 37/226* (2013.01); *H01J 37/32082* (2013.01); *H01L 21/0274* (2013.01); *H01L 21/306* (2013.01); *H01L 21/3065* (2013.01); *H01L 22/12* (2013.01); *H01L 22/26* (2013.01); *G01N 2201/06106* (2013.01); *H01J 2237/2445* (2013.01); *H01J 2237/334* (2013.01)

(58) Field of Classification Search
None
See application file for complete search history.

(56) References Cited

U.S. PATENT DOCUMENTS 6,958,484 B2 10/2005 Mitrovic
8,158,017 B2 * 4/2012 Hudson ............ H01J 37/32935
216/59

(Continued)

FOREIGN PATENT DOCUMENTS

JP          3878745 B2    2/2007
KR    10-1858265 B1    5/2015

(Continued)

*Primary Examiner* — Stephanie P Duclair
(74) *Attorney, Agent, or Firm* — Muir Patent Law, PLLC

(57) ABSTRACT

A substrate processing method includes providing a substrate into a process chamber; introducing a reference light into the process chamber; generating a plasma light in the process chamber while performing an etching process on the substrate; receiving the reference light and the plasma light; and detecting an etching end point by analyzing the plasma light and the reference light. Detecting the etching end point includes a compensation adjustment based on a change rate of an absorption signal of the reference light with respect to a change rate of an emission signal of the plasma light.

18 Claims, 9 Drawing Sheets

(51) Int. Cl.
    *H01L 21/306*     (2006.01)
    *H01L 21/027*     (2006.01)
    *H01J 37/32*     (2006.01)
    *H01J 37/22*     (2006.01)
    *G01N 21/94*     (2006.01)

(56) References Cited

U.S. PATENT DOCUMENTS

| | | |
|---|---|---|
| 8,358,416 B2 | 1/2013 | Venugopal et al. |
| 9,972,478 B2 | 5/2018 | Guha et al. |
| 10,008,370 B2 | 6/2018 | Ohmori et al. |
| 10,194,108 B2 | 1/2019 | Chuang et al. |
| 2004/0080050 A1* | 4/2004 | McMillin .......... H01L 21/31116 |
| | | 257/758 |
| 2008/0176149 A1* | 7/2008 | Grimbergen .............. C23F 4/00 |
| | | 430/5 |
| 2011/0137446 A1 | 6/2011 | Valcore, Jr. et al. |
| 2014/0038091 A1* | 2/2014 | Grimbergen .............. G03F 1/80 |
| | | 430/5 |
| 2018/0053661 A1 | 2/2018 | Park et al. |

FOREIGN PATENT DOCUMENTS

| | | |
|---|---|---|
| KR | 10-2017-0141806 A | 12/2017 |
| KR | 10-2018-0019906 A | 2/2018 |
| KR | 10-2018-0089201 A | 8/2018 |

\* cited by examiner

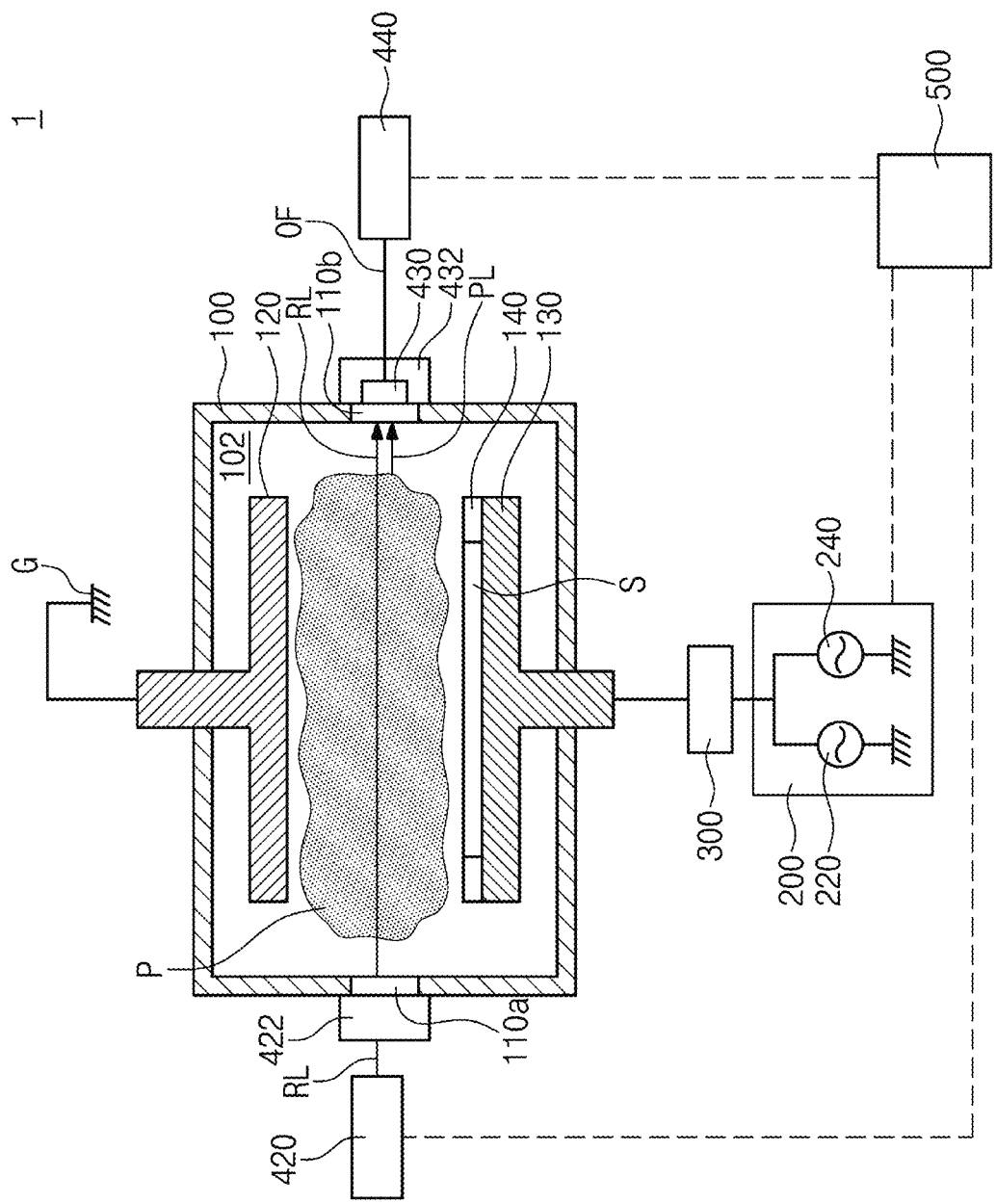

SUBSTRATE PROCESSING APPARATUS, SUBSTRATE PROCESSING METHOD, AND METHOD OF FABRICATING SEMICONDUCTOR DEVICE USING THE SAME

CROSS-REFERENCE TO RELATED APPLICATION

This U.S. nonprovisional application claims priority under 35 U.S.C § 119 to Korean Patent Application No. 10-2018-0145245, filed on Nov. 22, 2018 in the Korean Intellectual Property Office, and the entire contents of which are hereby incorporated by reference.

BACKGROUND

The present inventive concepts relate to an apparatus and method of processing a substrate and a method of fabricating a semiconductor device, and more particularly, to a substrate processing apparatus that detects an etching end point, a substrate processing method, and a method of fabricating a semiconductor device using the same.

Semiconductor devices are fabricated using various semiconductor manufacturing processes such as deposition processes, ion implantation processes, photolithography processes, and etching processes. A plasma may be used to perform some of the semiconductor manufacturing processes. As the semiconductor devices have become highly integrated, the structures of the semiconductor devices have been complicated. In particular, semiconductor devices having more complicated structures have been recently developed. Accordingly, the semiconductor manufacturing processes are more complicated and thus increased fabrication time is often required to fabricate semiconductor devices.

SUMMARY

Some example embodiments of the present inventive concepts provide a substrate processing apparatus and method with improved detectability and reliability.

According to some example embodiments of the present inventive concepts, a substrate processing method may comprise: providing a substrate into a process chamber; introducing a reference light into the process chamber; generating a plasma light in the process chamber while performing an etching process on the substrate; receiving the reference light and the plasma light; and detecting an etching end point by analyzing the plasma light and the reference light. The step of detecting the etching end point may include a compensation adjustment based on a change rate of an absorption signal of the reference light with respect to a change rate of an emission signal of the plasma light.

According to some example embodiments of the present inventive concepts, a substrate processing method may comprise: providing a substrate into a process chamber; using a light source to introduce a reference light into the process chamber; using a radio frequency (RF) power supply to provide a RF power to generate a plasma light in the process chamber; and monitoring a condition of the process chamber by receiving the reference light and the plasma light. The step of monitoring the condition of the process chamber may comprise: obtaining an absorption signal of the reference light and an emission signal of the plasma light; obtaining an emission signal of the plasma light; and obtaining the absorption signal of the reference light by eliminating the emission signal of the plasma light from the absorption signal of the reference light and the emission signal of the plasma light.

According to some example embodiments of the present inventive concepts, a method of fabricating a semiconductor device may comprise: providing a process chamber with the semiconductor device including an etching target layer; performing an etching process on the semiconductor device; monitoring a condition of the process chamber to detect an etching end point; and after detecting the etching end point, terminating the etching process and then performing a subsequent process on the semiconductor device. The step of performing the etching process may comprise: using a light source to introduce a reference light into the process chamber; and using a radio frequency (RF) power supply to provide a RF power to generate a plasma light in the process chamber. The step of detecting the etching end point may comprise: analyzing the plasma light to obtain an emission signal of the plasma light; analyzing the reference light to obtain an absorption signal of the reference light; and compensating for the detection of the etching end point by considering the absorption signal of the reference light with respect to the emission signal of the plasma light.

According to some example embodiments of the present inventive concepts, a substrate processing apparatus may comprise: a process chamber including first and second viewports facing each other; a light source adjacent to the first viewport and providing the process chamber with a reference light; a radio frequency (RF) power supply providing a RF power to generate a plasma light in the process chamber; a light-receiving part adjacent to the second viewport and arranged to receive the reference light and the plasma light; an analyzer receiving the reference light and the plasma light from the light-receiving part and configured to analyze the reference light and the plasma light; and a polarizing filter adjacent to the light-receiving part and filtering at least a portion having a transverse electric wave (TE) mode of a light received on the second viewport.

Details of other example embodiments are included in the description and drawings.

BRIEF DESCRIPTION OF THE DRAWINGS

FIGS. 3A to 3G illustrate a method of fabricating a semiconductor device such as shown in FIGS. 2A and 2B.

DETAILED DESCRIPTION OF EMBODIMENTS

Some example embodiments of the present inventive concepts will be described below in detail with reference to the accompanying drawings.

Figure 1:
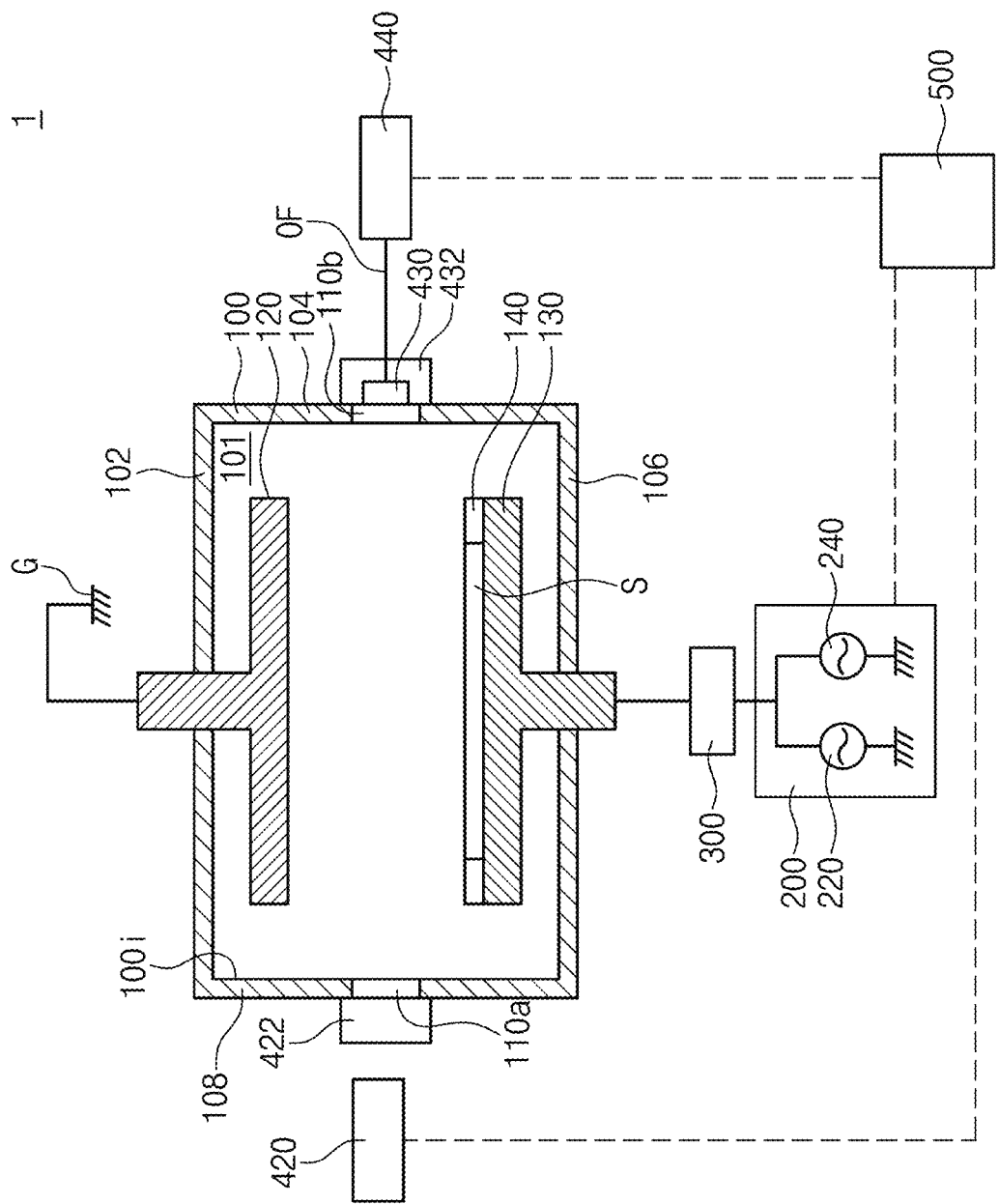
FIG. 1 illustrates a schematic diagram showing a substrate processing apparatus according to some example embodiments of the present inventive concepts.

FIG. 1 illustrates a schematic diagram showing a substrate processing apparatus 1 according to some example embodiments of the present inventive concepts. The substrate processing apparatus 1 may use, for example, a plasma to etch a substrate S. The substrate S may be a semiconductor substrate for fabricating a semiconductor device, such as for fabricating a plurality of integrated circuits on a wafer that form semiconductor chips when singulated from the wafer, or may be a glass substrate for manufacturing a flat display device, but the present inventive concepts are not limited thereto.

The substrate processing apparatus 1 may be a capacitively coupled plasma processing apparatus, but alternatively may be an inductively coupled plasma processing apparatus, a microwave plasma processing apparatus, or any other type of plasma processing apparatus. The following will describe an example in which the substrate processing apparatus 1 is a capacitively coupled plasma processing apparatus. To effectively perform plasma processing processes, it may be important to inspect an internal condition of a process chamber and to check a plasma condition (electron density, ion density, etc.)

The substrate processing apparatus 1 may include a process chamber 100, a radio frequency (RF) power supply 200, a matcher 300, a light source 420, a light-receiving part OF, an analysis part 440, and a controller 500.

The process chamber 100 may have an internal space 101 where the substrate W is processed. A plasma (see P of FIG. 3C) may be generated in the internal space 101, in which the substrate S is processed by the plasma. The process chamber 100 may have a hermetic structure to maintain a vacuum state. The process chamber 100 may include one or more of metal and dielectric materials. Although not shown, the process chamber 100 may include upper and lower chamber portions combined with each other, and may have a hollow hexahedral shape, a hollow cylindrical shape, or any other shapes.

The process chamber 100 may include first, second, third, and fourth walls 102, 104, 106, and 108. The first wall 102 may be an upper wall, and the third wall 106 may be a lower wall facing the first wall 102. The second wall 104 may be a lateral wall, and the fourth wall 108 may be an opposite lateral wall facing the second wall 104.

The process chamber 100 may include viewports 110a and 110b, a showerhead 120, and a stage 130.

The viewports 110a and 110b may be provided on the process chamber 100. A first viewport 110a may be installed on a lateral wall of the process chamber 100, and a second viewport 110b may be installed on an opposite lateral wall facing the lateral wall. For example, the first viewport 110a may be disposed on the fourth wall 108 of the process chamber 100, and the second viewport 110b may be disposed on the second wall 104. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "third" in a particular claim) may be described elsewhere with a different ordinal number (e.g., "first" in the specification or another claim).

The viewports 110a and 110b may be made of glass, quartz, or other materials transparent to light. The viewports 110a and 110b may be transparent to infrared rays, ultraviolet rays, or visible light bands. The viewports 110a and 110b may be provided in openings that are hermetically sealed to allow the process chamber 100 to maintain a vacuum state without introduction of impurities.

The viewports 110a and 110b are not limited to being disposed on the lateral walls of the process chamber 100, but may be disposed on an upper wall of the process chamber 100 or on a gas exhaustion part (not shown) of the process chamber 100. The viewports 110a and 110b may be anti-reflectively coated, and may have their transmittance that is constant irrespective of wavelength. FIG. 1 shows two viewports 110a and 110b facing each other, but the number and arrangement of the viewports 110a and 110b may not be limited thereto. The viewports 110a and 110b may further be provided with deposition shields. In one embodiment, the viewports 110a and 110b may form the lateral walls of the process chamber 100, so that the walls of the process chamber 100 include the viewports. For example, the second wall 104 and fourth wall 108 may be formed in part by a chamber housing material or materials (e.g., metal and dielectric materials) and in part by a viewport formed, for example, of a transparent material (e.g., glass, quartz, etc.).

Although not shown, the process chamber 100 may further include a gas supply port and a gas exhaustion port. A process gas for processing a semiconductor device may be supplied through the gas supply port (not shown), and a non-reacted source gas and byproducts of semiconductor device processes may be drained through the gas exhaustion port (not shown). The process gas may include, for example, one or more of $CF_4$, $C_4F_6$, $C_4F_8$, COS, $CHF_3$, HBr, $SiCl_4$, $O_2$, $N_2$, $H_2$, $NF_3$, $SF_6$, He, Xe, and Ar. The present inventive concepts, however, are not limited thereto.

The showerhead 120 may be placed in the internal space 101 of the process chamber 100. The showerhead 120 may be installed in an inner upper portion of the process chamber 100. The showerhead 120 may supply the process gas into the process chamber 100. The showerhead 120 may uniformly spray the process gas onto substrate S. The showerhead 120 may serve as a top electrode. The showerhead 120 may be connected to a reference potential. For example, while a plasma etching process is performed, the showerhead 120 may be grounded (G) or alternatively connected to a radio frequency (RF) power. Hereinafter, the showerhead 120 may also be called a top electrode.

The stage 130 may be provided in the internal space 101 of the process chamber 100, thereby supporting a semiconductor device. The substrate S may be loaded on a top surface of the stage 130. The stage 130 may be installed in an inner bottom side of the process chamber 100. The stage 130 may be disposed to face the showerhead 120. The stage 130 may serve as a bottom electrode into which a plurality of RF powers are supplied from the RF power supply 200. The stage 130 may be shaped like a flat plate. For example, the stage 130 may be equipped with an electrostatic chuck that uses an electrostatic power to rigidly place a semiconductor device, such as a semiconductor wafer, thereon. The stage 130 may include a heater that heats a semiconductor device to a temperature suitable for plasma treatment. For example, the heater may be provided in the form of a hot wire embedded in the stage 130. Hereinafter, the stage 130 may also be called a bottom electrode. The stage 130 may have on its top surface a confinement ring 140 provided outside the substrate S.

The RF power supply 200 may be provided to supply the bottom electrode 130 with a radio frequency (RF) power for plasma generation or plasma control. The RF power supply 200 may be provided as a single power generator or a plurality of power generators. For example, the RF power supply 200 may include a first RF power generator 220 and a second RF power generator 240. Optionally, the RF power supply 200 may apply a RF power not only to the bottom electrode 130 but also to any other component. For example, the RF power supply 200 may apply a RF power to the top electrode 120.

The first RF power generator 220 may supply a first RF power having a first frequency. The first RF power generator 220 may be a source RF power supply that applies a source RF power, and the first RF power may generate a plasma in the process chamber 100. For example, when the first RF power is applied to the bottom electrode 130, the plasma may be generated from a process gas introduced into the process chamber 100. Alternatively, there may be provided a plurality of first RF power generators 220 each of which applies a source RF power.

The second RF power generator 240 may supply a second RF power having a second frequency. The second frequency may be lower than the first frequency. The second RF power generator 240 may be a bias RF power supply, and the second RF power may cause cations to travel onto the substrate S. In this description, the first and second frequencies may be a radio frequency (RF).

When the RF power supply 200 applies a radio frequency energy to the process chamber 100, the bottom electrode 130 and the top electrode 120 may have therebetween an electric field caused by a difference in electrical potential therebetween, with the result that a plasma may be generated in the process chamber 100. A density of the plasma generated on the substrate S may be changed depending on a difference in potential between the bottom electrode 130 and the top electrode 120. The radio frequency of the RF power supply 200 may be controlled to adjust conditions of the plasma in the process chamber 100.

The matcher 300 may be an RF match circuit installed between the RF power supply 200 and the process chamber 100. The matcher 300 may reduce or minimize loss of the RF powers generated from the RF power supply 200. It therefore may be used to obtain an increased transfer efficiency of the RF powers provided from the RF power supply 200 to the bottom electrode 130. The matcher 300 may be provided in plural to correspond to the number of the RF power generators 220 and 240, and the plurality of matchers 300 may be connected to corresponding RF power generators 220 and 240. The plurality of matchers are omitted for brevity of illustration.

The light source 420 may be disposed adjacent to the first viewport 110a. The light source 420 may be driven at low power (e.g., 1 mW or less), and thus may have no effect on a chemical reaction (e.g., excitement or dissociation) of the plasma. The light source 420 may be, for example, a lamp including xenon (Xe). The light source 420 and the first viewport 110a may be provided with a first collimator 422 therebetween outside the first viewport 110a. The first collimator 422 may be a collimator lens, but the present inventive concepts are not limited thereto. The first collimator 422 may collimate a reference light (see RL of FIG. 3C) released from the light source 420 (e.g., a light beam generated and output from the light source 420). Although not shown, an optical fiber cable may be provided between the light source 420 and the first collimator 422.

The light-receiving part OF may be disposed adjacent to the second viewport 110b. The light-receiving part OF may be, for example, an optical fiber. The light-receiving part OF may receive the reference light RL emitted from the light source 420 and a plasma light PL generated from a plasma P (see FIG. 3C). In this description, for clarity of description, the reference light RL emitted from the light source 420 is explained independently of the plasma light PL generated from the plasma P.

The light-receiving part OF and the second viewport 110b may be provided with a second collimator 432 therebetween, formed outside the second viewport 110b. The second collimator 432 may be a collimator lens, but the present inventive concepts are not limited thereto. The second collimator 432 may collimate light that is received from inside the chamber 100 and transmitted toward the light-receiving part OF.

A filter 430 may be provided between the second collimator 432 and the second viewport 110b. The filter 430 may filter at least a portion of the light received from inside the chamber 100 and transmitted toward the light-receiving part OF. The filter 430 may filter a polarized component of the light received from inside the chamber 100. For example, the filter 430 may filter at least a portion having a transverse electric wave (TE) mode of the light received from inside the chamber 100 at the filter 430, such that this portion is not transmitted to the light-receiving part OF. The filtering of the TE mode component may eliminate a noise component produced in the process chamber 100, for example, amplified noise caused by reflection between the showerhead 120 and the substrate S. The light-receiving part OF may transfer the received light (e.g., the filtered, collimated light) to the analysis part 440.

The analysis part 440 may be an analyzer and include equipment such as a spectrometer. For example, the analysis part 400, such as a spectrometer, may include measurement components, as well as hardware and software components configured to perform measurement and analysis tasks such as those described herein. The analysis part 440 may use optical emission spectroscopy (OES) mode and optical absorption spectroscopy (OAS). The analysis part 440 may convert the reference light RL and the plasma light PL into electrical signals, and analyze the converted electrical signals. For example, the analysis part 440 may receive the plasma light PL to analyze an emission signal of the plasma light PL, and also receive the reference light RL and the plasma light PL to analyze an absorption signal of the reference light RL. Through the process above, it is possible to monitor a condition of the process chamber 100. The analysis part 440 may include a display (not shown) as well as other user input-output devices for user control.

The controller 500 may control the showerhead 120, the stage 130, the RF power supply 200, the matcher 300, the light source 420, the light-receiving part OF, and the analysis part 440. For example, the controller 500 may control and synchronize the RF power supply 200, the light source 420, the light-receiving part OF, and the analysis part 440. For example, the controller 500 may include control components such as hardware and software components configured to perform control functions such as those described herein. A detailed description will be given below with reference to the accompanying drawings.

Figure 2A:
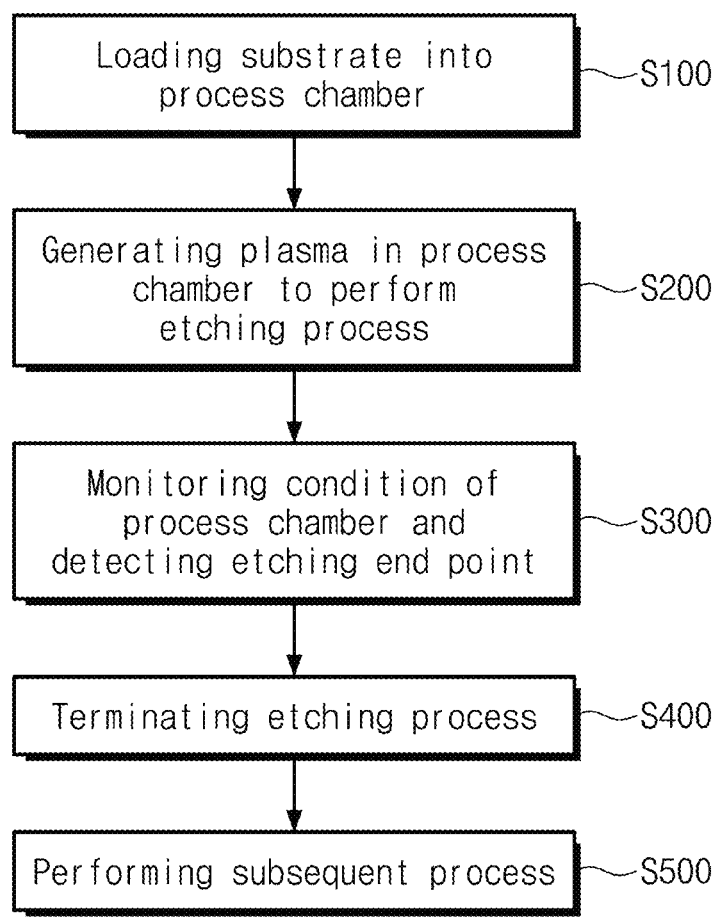
FIG. 2A illustrates a flow chart showing a method of fabricating a semiconductor device according to some example embodiments of the present inventive concepts.
Figure 2B:
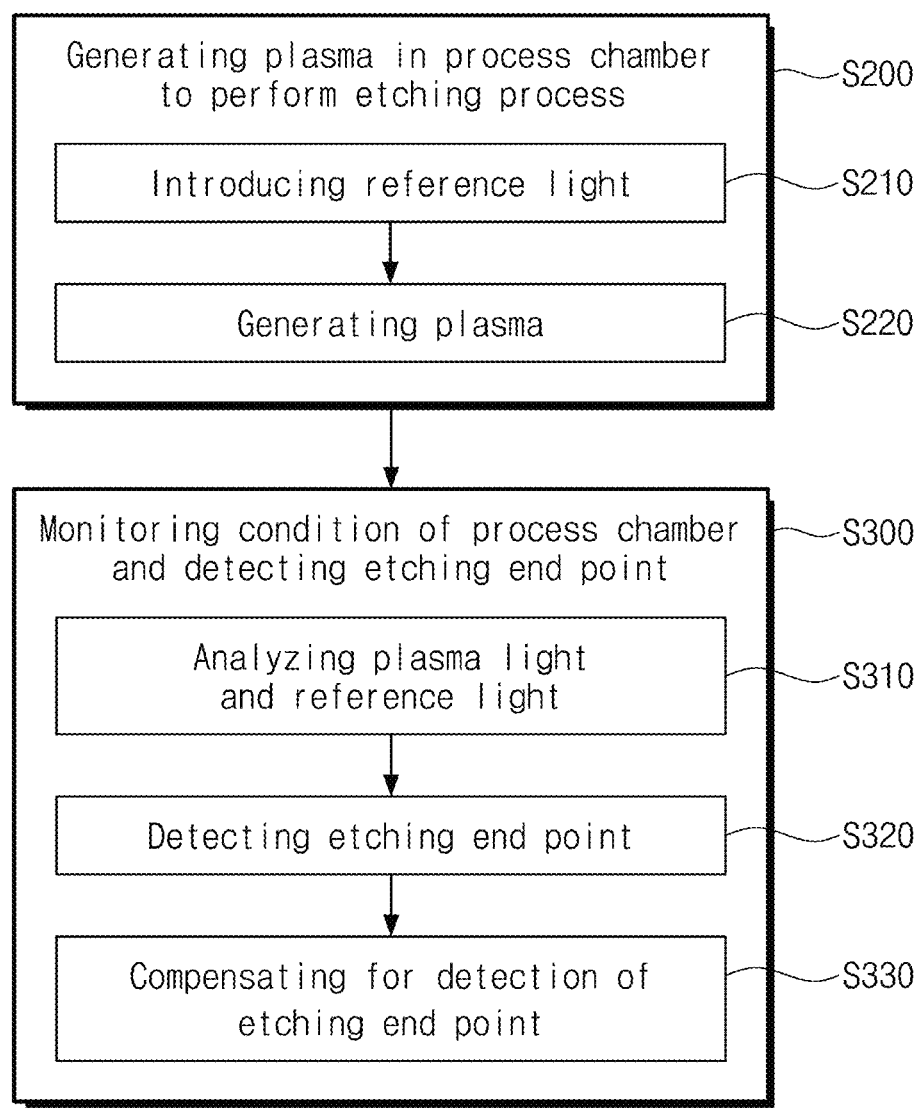
FIG. 2B illustrates a detailed flow chart showing a step of performing an etching process and a step of monitoring a condition of a process chamber and detecting an etching end point shown in the flow chart of FIG. 2A.

FIG. 2A illustrates a flow chart showing a method of fabricating a semiconductor device according to some example embodiments of the present inventive concepts. FIG. 2B illustrates a detailed flow chart showing a step S200 of performing an etching process and a step S300 of monitoring a condition of the process chamber and detecting an etching end point shown in the flow chart of FIG. 2A. Thus, FIGS. 2A and 2B illustrate one example embodiment. FIGS. 3A to 3G illustrate a method of fabricating a semiconductor device shown in FIGS. 2A and 2B. The following will describe a method of fabricating a semiconductor device according to some example embodiments of the present inventive concepts with reference to FIGS. 2A to 3G.

Referring to FIG. 2A, the substrate S may be loaded on the process chamber 100 (S100). The substrate S may be received on the stage 130. Although not shown, an elevation member (e.g., a robot arm) or the like may be provided to load the substrate S. The substrate S may be a semiconductor substrate for fabricating a semiconductor device, or a glass substrate for manufacturing a flat display device, but the present inventive concepts are not limited thereto.

Figure 3A:
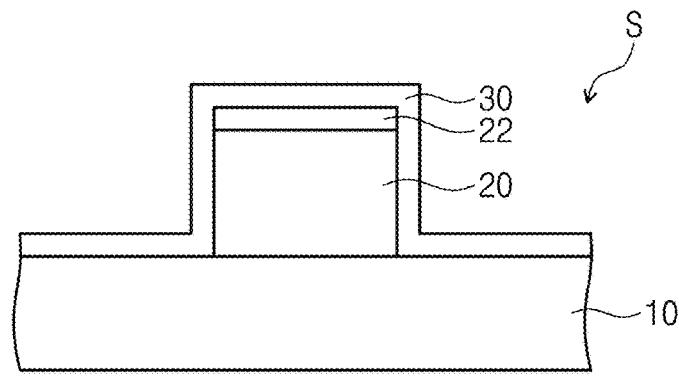

Referring to FIG. 3A, the substrate S may include a semiconductor layer 10, a pattern 20, an anti-reflection layer 22, and an etching target layer 30. The semiconductor layer 10 may be a silicon substrate, a germanium substrate, or a silicon-germanium substrate. The pattern 20 may be formed on the semiconductor layer 10, and the anti-reflection layer 22 and the etching target layer 30 may be formed on the pattern 20. Except for the etching target layer 30, the semiconductor layer 10, the pattern 20, and the anti-reflection layer 22 may be non-etching target layers.

The etching target layer 30 may be composed of a semiconductor material, a conductive material, a dielectric material, or a combination thereof. For example, when the etching target layer 30 is composed of a semiconductor material, the etching target layer 30 may include the same semiconductor material as that of the semiconductor substrate and/or that of an epitaxial layer. Alternatively, the etching target layer 30 may include a conductive material such as doped polysilicon, metal silicide, metal, metal nitride, or a combination thereof When the etching target layer 30 is composed of a dielectric material, the etching target layer 30 may include a dielectric material such silicon oxide, silicon nitride, silicon oxynitride, low-k dielectric whose dielectric constant is less than that of silicon oxide, or a combination thereof. Alternatively, the etching target layer 30 may include crystalline silicon, amorphous silicon, impurity doped silicon, silicon-germanium, carbon-based material, or a combination thereof FIG. 3A shows the etching target layer 30 is composed of a single layer, but alternatively the etching target layer 30 may be formed of a plurality of stacked layers. For example, the etching target layer 30 may include a plurality of stacked dielectric layers and further include at least one conductive or semiconductor layer between the dielectric layers.

Referring to FIGS. 2A and 2B, a plasma is generated in the process chamber 100 to perform an etching process (S200). The etching process includes introducing a reference light into the process chamber 100 (S210) and generating the plasma (S220). The introduction of the reference light into the process chamber 100 (S210) may be performed simultaneously with the generation of the plasma (S220).

Referring to FIGS. 2A, 2B, and 3C to 3G, a step may be performed to monitor a condition of the process chamber 100 and to detect an etching end point (S300). The step of monitoring the condition of the process chamber 100 and detecting the etching end point (S300) may include analyzing a plasma light and the reference light (S310), detecting the etching end point (S320), and compensating for the detection of the etching end point (S330).

Figure 3B:
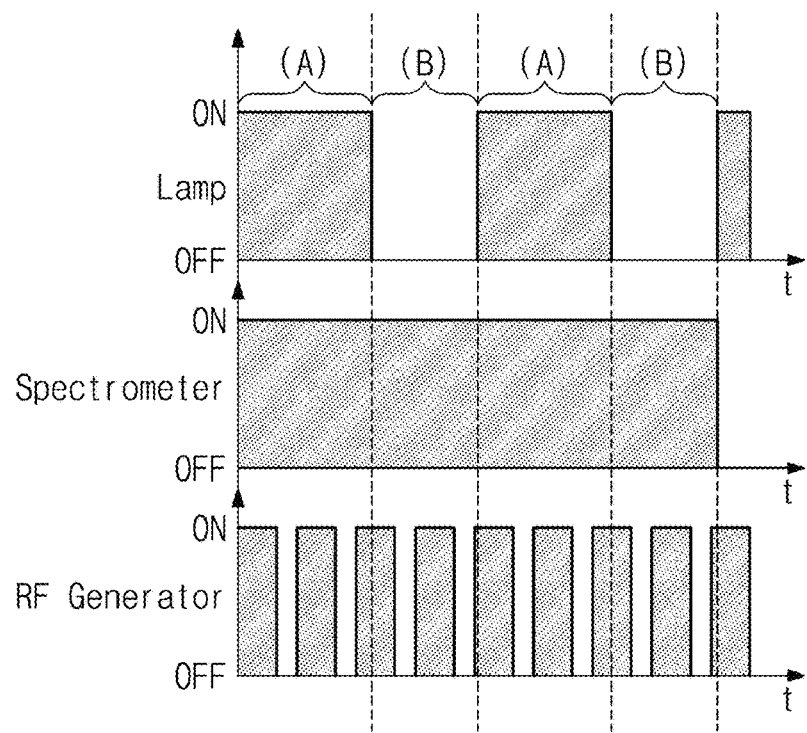

For example, referring to FIG. 3B, the controller 500 may control ON/OFF states of each of the light source 420, the analysis part 440, and the RF power supply 200. FIG. 3B shows an example in which the controller 500 controls a Xenon lamp as the light source 420, a spectrometer as the analysis part 440, and the first RF power generator 220 as the source RF power generator.

The controller 500 may synchronize and simultaneously turn on the light source 420, the spectrometer 440, and the first RF power generator 220. The light source 420 and the RF power may be supplied in a pulsed mode. In the figures, time durations are shown for brevity of illustration, and may be different from actual period of times. For example, an ON/OFF period of the light source 420 may correspond to several seconds [s], but an ON/OFF period of the first RF power generator 220 may correspond to several milliseconds [ms]. The ON/OFF period of the first RF power generator 220 may be relatively shorter, and may have a frequency such that the plasma-producing effect can be controlled to be similar to that which occurs when the first RF power generator 220 is always in an ON state.

Based on a first duration or time period (e.g., duration (A) of FIG. 3B) in which the light source 420 is in an ON state and a second duration (or duration (B) of FIG. 3B) in which the light source 420 is an OFF state, the controller 500 may analyze the plasma light PL and the reference light RL (S310). FIG. 3C illustrates a schematic diagram corresponding to the first duration (A), and FIG. 3D illustrates a schematic diagram corresponding to the second duration (B).

Referring to FIGS. 3B and 3C, in the first duration (A), the light source 420 supplies the process chamber 100 with the reference light RL, and the plasma light PL is generated from the plasma P. In the first duration (A), the light-receiving part OF receives the reference light RL and the plasma light PL at the same time. In this case, it is possible to obtain an absorption signal from the reference light RL and also to obtain an emission signal of the plasma light PL. In this description, it is assumed that the reference light RL has no effect on the emission signal, or on the optical emission spectroscopy (OES). In contrast, the plasma light PL may have an effect on the emission signal and the absorption signal.

Figure 3D:
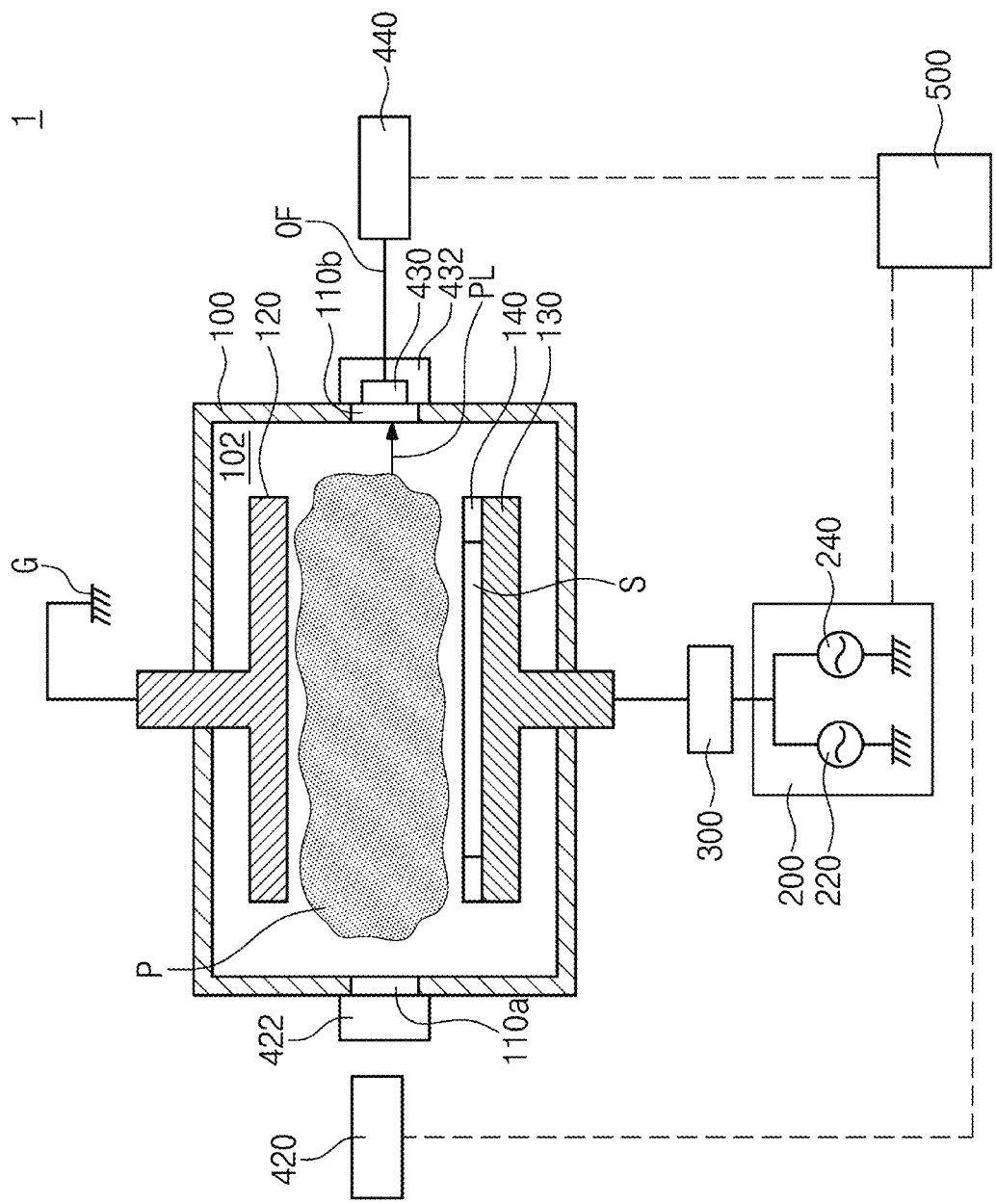

Referring to FIGS. 3B and 3D, in the second duration or time period (e.g., B), the light source 420 is in an OFF state, and thus only the plasma light PL is generated from the plasma P. In the second duration (B), the light-receiving part OF receives only the plasma light PL. In this case, it may be possible to obtain the emission signal of the plasma light PL.

The controller 500 is configured to use the absorption and emission signals obtained from the plasma light PL in the second duration (B) to extract only the absorption signal of the reference light RL, thereby compensating for the light generated by the plasma. For example, the controller 500 may extract only the absorption signal of the reference light RL by eliminating the absorption and emission signals of the plasma light PL obtained in the second duration (B) from the absorption signal of the reference light RL and the emission signal of the plasma light PL obtained in the first duration (A). Also, the controller 500 may use data of the first and second durations (A) and (B) to detect the emission signal of the plasma light PL and the absorption signal of the reference light RL.

Figure 3E:
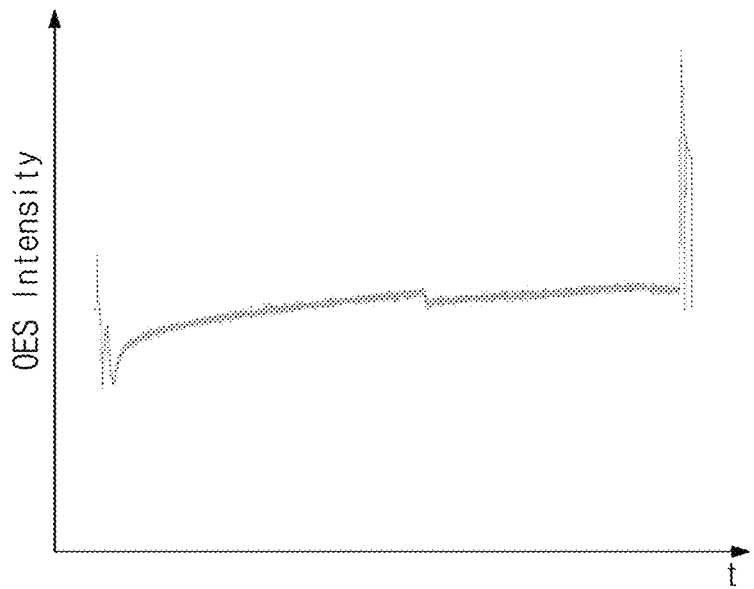

Referring to FIG. 3E, it may be possible to ascertain an intensity of the emission signal of the plasma light PL. In this case, it may be difficult to detect an etching end point. The etching end point may be recognized when the intensity of the emission signal of the plasma light PL is greatly changed at the moment that the etching target layer (see 30 of FIG. 3A) is etched to expose the non-etching target layer (e.g., the reference numeral 22 of FIG. 3A). However, referring to FIG. 3E, it may be hard to detect a point where the intensity of the emission signal of the plasma light PL is abruptly changed.

Figure 3F:
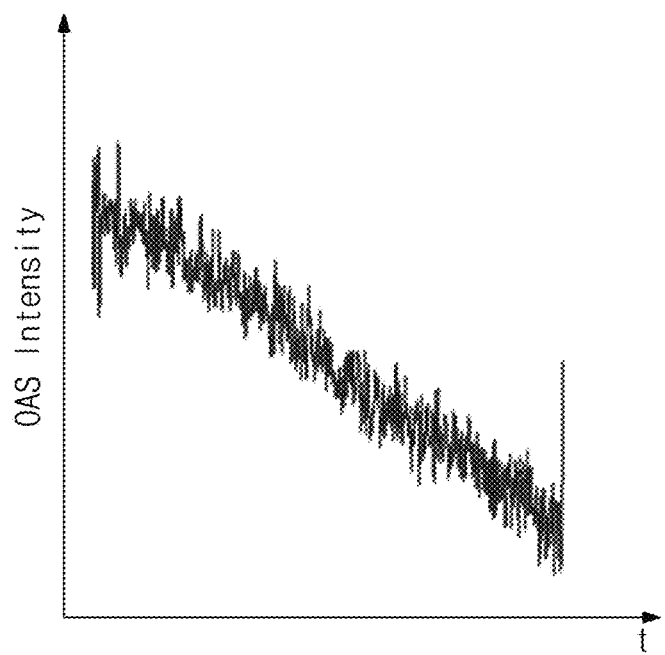

Referring to FIG. 3F, it may be possible to ascertain an intensity of the absorption signal of the reference light RL. The reference light RL may be provided at lower power to minimally affect a chemical reaction inside the process chamber 100. However, it may be seen that the reference light RL decreases in output intensity and therefore increases the magnitude of the absorption signal as the time goes by, and thus it may be found that external factors reduce the output intensity and therefore increase the magnitude of the absorption signal of the reference light RL. A pollution level of the process chamber 100 may be detected by real-time monitoring the absorption signal of the reference light RL. For example, it may be possible to detect contamination of an inner surface 110i of the process chamber 100 or the viewports 110a and 110b. Accordingly, the viewports 110a and 110b or any other components may be replaced if needed.

For example, the reduction in intensity of the reference light RL as indicated by an increase in magnitude of the absorption signal of the reference light RL may be used to ascertain the pollution level inside the process chamber 100, and this may be used to estimate an influence on an intensity of a reflection signal of the plasma light PL.

According to aspects of the present inventive concepts, the etching end point may be detected and compensated for (e.g., an inaccurate determination of the etching end point due to changes in the plasma chamber, such as additional contaminants, may be corrected) by considering a change rate of the absorption signal of the reference light RL with respect to a change rate of the emission signal of the plasma light PL (S320 and S330). For example, an error of the etching end point may be compensated for (e.g., by performing a compensation adjustment) by dividing the change rate of the emission signal of the plasma light PL by the change rate of the absorption signal of the reference light RL. The change rate of the emission signal of the plasma light PL may be obtained from the emission signal of the plasma light PL at a certain time (e.g., by detecting a series of emission measurements over a period of time and determining the rate of change at a given time based on an overall emission-versus-time curve), and the change rate of the absorption signal of the reference light RL may be obtained from the absorption signal of the reference light RL at a certain time (e.g., by detecting a series of absorption measurements over a period of time and determining the rate of change at a given time based on an overall absorption-versus-time curve). For example, when the change rate of the emission signal is divided by the change rate of the absorption signal for a series of time points, the resulting values may form a characteristic graph that includes a clear change point (also described as a signal edge point, or a signal jump) where a graph curve abruptly changes. The time point at which one of these change points occurs may correspond to an etching end point. Therefore, it may be possible to compensate for an error caused by internal contamination. The detection and error compensation for the etching end point (S320 and S330) may be performed at the same time, but the present inventive concepts are not limited thereto. The etching end point may be referred to as an etching completion point.

Figure 3G:
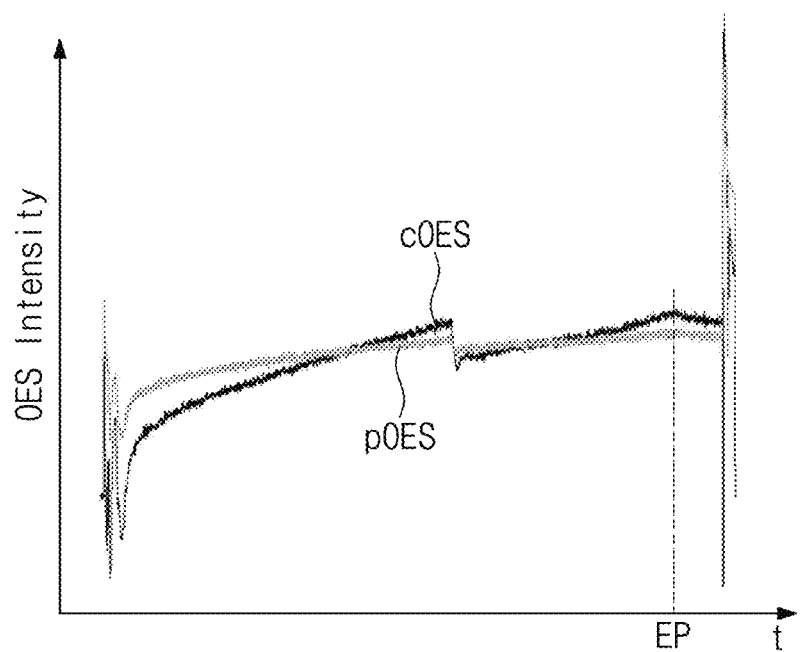

FIG. 3G shows a graph that compares an emission signal pOES of a plasma light according to comparative examples with an emission signal cOES of a plasma light that is compensated for according to some example embodiments of the present inventive concepts. The emission signal pOES of the plasma light of the comparative example may be the same as data of FIG. 3E. The compensated emission signal cOES of the plasma light may be used to more easily detect an etching end point EP by compensating for detection errors caused by internal contamination, as discussed above. Accordingly, reliability may improve and detectability may increase. In FIG. 3G, the etching end point EP may correspond to a time point at which the graph of cOES is abruptly bent near to its end point.

Referring to FIG. 2A, when the etching end point is ascertained, the etching process may be terminated (S400), and then subsequent processes may be performed on the substrate S (S500). Because the etching end point indicates that the non-etching target layer (e.g., the reference numeral 22 of FIG. 3A) is exposed, after the etching end point is ascertained, the etching process may be promptly terminated. The subsequent processes may be, but are not limited to, a cleaning process and any other processes for fabricating various layers, patterns, and components of a semiconductor device to form an integrated circuit on a die, that can be singulated into chips, and formed into semiconductor packages. If needed, the substrate S may undergo the subsequent processes in the same process chamber 100, or may be unloaded from the process chamber 100 and then loaded in other process chamber.

According to the present inventive concepts, a substrate processing apparatus and method may be provided that have improved detectability and reliability.

Figure 4:
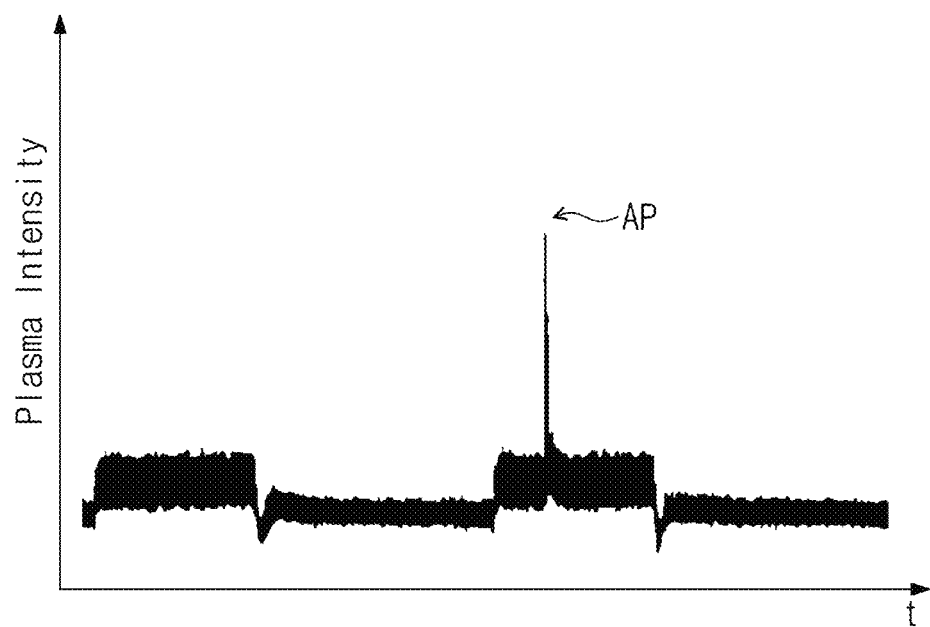
FIG. 4 illustrates a graph showing a plasma intensity according to some example embodiments of the present inventive concepts.

FIG. 4 illustrates a graph showing a plasma intensity according to some example embodiments of the present inventive concepts. The controller 500 may detect a specific time AP that an arcing occurs when the absorption signal of the reference light RL is monitored by connecting an optical sensor (e.g., Fast-Time OES) to the light-receiving part OF and the analysis part 440. In a case where a component analysis is performed at the specific time AP, the optical sensor may be used to find a certain component (e.g., showerhead) at which the arcing occurs.

According to some example embodiments of the present inventive concepts, it may be possible to provide substrate processing apparatus and method with improved detectability and reliability.

The effects of the present inventive concepts are not limited to the aforementioned effects. Other effects, which are not mentioned above, will be apparently understood by one skilled in the art from the foregoing description and accompanying drawings.

These embodiments herein are presented to facilitate understanding of the present inventive concepts and should not limit the scope of the present inventive concepts, and it is intended that the present inventive concepts cover the various combinations, the modifications, and variations. The technical protection scope of the present inventive concepts will be defined by the technical spirit of the appended claims, and is intended to include all modifications and equivalent substantially falling within the spirit and scope of the invention while not being limited by literary descriptions in the appended claims.

What is claimed is:

1. A substrate processing method, comprising:
providing a substrate into a process chamber;
introducing a reference light into the process chamber;
generating a plasma light in the process chamber while performing an etching process on the substrate;
receiving the reference light and the plasma light; and
detecting an etching end point by analyzing the plasma light and the reference light,
wherein detecting the etching end point includes a compensation adjustment based on a change rate of an absorption signal of the reference light with respect to a change rate of an emission signal of the plasma light, and wherein receiving the reference light and the plasma light comprises filtering and receiving at least a portion having a transverse electric wave (TE) mode of the reference light and the plasma light.

2. The substrate processing method of claim 1, wherein analyzing the plasma light comprises obtaining the change rate of the emission signal of the plasma light, analyzing the reference light comprises obtaining the change rate of the absorption signal of the reference light, and detecting the etching end point comprises obtaining a compensated emission signal of the plasma light by dividing the change rate of the emission signal of the plasma light by the change rate of the absorption signal of the reference light.

3. The substrate processing method of claim 1, wherein the reference light is introduced by a light source, and the plasma light is introduced by supplying a radio frequency (RF) power generated from a RF power supply, and the light source and the RF power supply are synchronized such that introducing the reference light is simultaneously performed with generating the plasma light.

4. The substrate processing method of claim 3, wherein the light source and the RF power supply are ON/OFF switched in a pulsed mode, and wherein receiving the reference light and the plasma light comprises:

a first duration in which the reference light and the plasma light are received; and a second duration in which the plasma light is selectively received without the reference light.

5. The substrate processing method of claim 4, wherein receiving the reference light and the plasma light comprises:

in the first duration, obtaining an absorption signal of the reference light and an emission signal of the plasma light; and in the second duration, obtaining an emission signal of the plasma light.

6. The substrate processing method of claim 5, wherein the compensation adjustment comprises obtaining the absorption signal of the reference light by eliminating the emission signal of the plasma light obtained in the second duration from the absorption signal of the reference light and the emission signal of the plasma light obtained in the first duration.

7. The substrate processing method of claim 1, further comprising receiving the reference light and the plasma light to monitor a condition of the process chamber.

8. The substrate processing method of claim 7, wherein monitoring the condition of the process chamber comprises monitoring a pollution level of an inner surface of the process chamber.

9. The substrate processing method of claim 7, wherein monitoring the condition of the process chamber comprises using the absorption signal of the reference light to analyze a component at which an arcing occurs in the process chamber.

10. The substrate processing method of claim 1, wherein introducing the reference light into the process chamber comprises providing the reference light to a first viewport on a sidewall of the process chamber, wherein the provided reference light is collimated by a first collimator adjacent to the first viewport.

11. The substrate processing method of claim 10, wherein receiving the reference light and the plasma light comprises providing the reference light and the plasma light to a second viewport disposed to face the sidewall of the process chamber, wherein the provided reference light and plasma light are collimated by a second collimator adjacent to the second viewport.

12. A substrate processing method, comprising:

providing a substrate into a process chamber;

using a light source to introduce a reference light into the process chamber;

using a radio frequency (RF) power supply to provide a RF power to generate a plasma light in the process chamber; and monitoring a condition of the process chamber by receiving the reference light and the plasma light, wherein receiving the reference light and the plasma light comprises filtering and receiving at least a portion having a transverse electric wave (TE) mode of the reference light and the plasma light, and wherein monitoring the condition of the process chamber comprises:

obtaining an absorption signal of the reference light and an emission signal of the plasma light;

obtaining an emission signal of the plasma light; and obtaining the absorption signal of the reference light by eliminating the emission signal of the plasma light from the absorption signal of the reference light and the emission signal of the plasma light.

13. The substrate processing method of claim 12, wherein monitoring the condition of the process chamber comprises monitoring a pollution level of an inner surface of the process chamber.

14. The substrate processing method of claim 12, wherein monitoring the condition of the process chamber comprises using the absorption signal of the reference light to analyze a component at which an arcing occurs in the process chamber.

15. The substrate processing method of claim 12, wherein the light source and the RF power supply are synchronized to switch into an ON state at the same time.

16. The substrate processing method of claim 15, wherein the light source and the RF power supply are switched in a pulsed mode, wherein receiving the reference light and the plasma light comprises:

a first duration in which are obtained the absorption signal of the reference light and the emission signal of the plasma light; and a second duration in which are obtained the emission signal of the plasma light.

17. The substrate processing method of claim 12, further comprising detecting an etching end point by analyzing the reference light and the plasma light, wherein detecting the etching end point comprises:

obtaining a change rate of the emission signal of the plasma light;

obtaining a change rate of the absorption signal of the reference light; and compensating for the detection of the etching end point by considering the change rate of the absorption signal of the reference light with respect to the change rate of the emission signal of the plasma light.

18. The substrate processing method of claim 17, wherein compensating for the detection of the etching end point comprises obtaining a compensated emission signal of the plasma light by dividing the change rate of the emission signal of the plasma light by the change rate of the absorption signal of the reference light.

\* \* \* \* \*